(12) United States Patent
Huang

(10) Patent No.: US 8,744,392 B2
(45) Date of Patent: Jun. 3, 2014

(54) AUTOMATIC GAIN CONTROL CIRCUIT AND AUTOMATIC GAIN CONTROL METHOD

(75) Inventor: Kung-Piao Huang, Hsinchu (TW)

(73) Assignee: Novatek Microelectronics Corp., Hsinchu (TW)

( * ) Notice: Subject to any disclaimer, the term of this patent is extended or adjusted under 35 U.S.C. 154(b) by 212 days.

(21) Appl. No.: 12/871,917

(22) Filed: Aug. 31, 2010

(65) Prior Publication Data

US 2012/0013399 A1    Jan. 19, 2012

(30) Foreign Application Priority Data

Jul. 16, 2010    (TW) ................................ 99123486 A

(51) Int. Cl.
*H04B 1/06*    (2006.01)
*H04B 7/00*    (2006.01)

(52) U.S. Cl.
USPC ..................................... 455/232.1; 455/234.1

(58) Field of Classification Search
CPC ...... H03G 3/3052; H03G 3/3068; H03G 3/22
USPC ............. 455/138, 232.1–250.1; 341/155–166
See application file for complete search history.

(56) References Cited

U.S. PATENT DOCUMENTS

| | | | |
|---|---|---|---|
| 5,946,607 A * | 8/1999 | Shiino et al. ............... | 455/234.1 |
| 6,038,435 A * | 3/2000 | Zhang ....................... | 455/234.1 |
| 6,081,565 A | 6/2000 | Marandi et al. | |
| 6,259,391 B1 * | 7/2001 | Pakravan et al. ............ | 341/139 |
| 6,292,120 B1 * | 9/2001 | Painchaud et al. ........... | 341/139 |
| 6,668,027 B1 * | 12/2003 | Scarpa ..................... | 375/345 |
| 6,690,312 B1 * | 2/2004 | Falkenberg et al. ......... | 341/144 |
| 7,030,800 B2 * | 4/2006 | Arai et al. ................. | 341/155 |
| 7,295,073 B2 * | 11/2007 | Hsieh et al. ................ | 330/279 |
| 7,605,730 B2 * | 10/2009 | Tomioka et al. ............. | 341/132 |
| 7,830,991 B2 * | 11/2010 | Dishman et al. ............. | 375/345 |

(Continued)

FOREIGN PATENT DOCUMENTS

| | | |
|---|---|---|
| CN | 101394519 | 3/2009 |
| EP | 1439636 | 7/2004 |
| TW | 200814684 | 3/2008 |
| TW | 200830727 | 7/2008 |
| TW | 200913598 | 3/2009 |

OTHER PUBLICATIONS

"'Office Action of Taiwan counterpart application" issued on Feb. 27, 2013, p. 1-p. 6.

(Continued)

*Primary Examiner* — Simon Nguyen
(74) *Attorney, Agent, or Firm* — Jianq Chyun IP Office

(57) ABSTRACT

An automatic gain control method includes receiving a sequence of multiple digital data, and calculating a plurality of signal values corresponding to the respective voltage values of the digital data, such as multiple peak-to-peak voltage values or power values, so as to optimize a gain according to variations in the output values. The gain optimization includes updating a reference value according to the signal values. If the reference value is less than a minimum threshold, the gain is increased to cause the reference value to reach the minimum threshold. The gain optimization also includes analyzing a clipping rate according to the signal values. If the clipping rate is equal to zero, then the gain is adjusted up. If the clipping rate is greater than zero, then the gain is adjusted down, such that the clipping rate is decreased to approach to zero.

25 Claims, 5 Drawing Sheets

(56) References Cited

U.S. PATENT DOCUMENTS

| | | | |
|---|---|---|---|
| 2002/0042256 A1* | 4/2002 | Baldwin et al. | 455/232.1 |
| 2003/0112088 A1* | 6/2003 | Bizjak | 333/14 |
| 2004/0130470 A1* | 7/2004 | Gregoire | 341/139 |
| 2006/0256892 A1 | 11/2006 | Momtaz | |
| 2008/0218395 A1 | 9/2008 | Tomioka et al. | |

OTHER PUBLICATIONS

"Office Action of China Counterpart Application", issued on Jun. 18, 2013, p. 1-p. 12.

"Office Action of China Counterpart Application", issued on Oct. 21, 2013, p. 1-p. 12.

* cited by examiner (a)

(b)

(c)

US 8,744,392 B2

AUTOMATIC GAIN CONTROL CIRCUIT AND AUTOMATIC GAIN CONTROL METHOD

CROSS-REFERENCE TO RELATED APPLICATION

This application claims the priority benefit of Taiwan application serial no. 99123486, filed on Jul. 16, 2010. The entirety of the above-mentioned patent application is hereby incorporated by reference herein and made a part of specification.

BACKGROUND

1. Field of the Invention

The disclosure generally relates to a signal processing technique, and more particularly, to an automatic gain control technique.

2. Description of Related Art

Signals are usually transmitted in a form of radio frequency (RF) signals in wireless communication. For a receiver, it needs to amplify an RF signal and then sample and digitize the analog signal for subsequent processing. If the RF signal is too weak, an optimized digitization resolution may not be achieved. Conversely, if the RF signal is excessively strong, saturation may occur during digitization of the RF signal because the digitization is limited by a valid analog-to-digital conversion range. As a result, the digitized signal may not be recovered to the originally transmitted signal and may also be easily affected by noise interference.

FIG. 1 illustrates a conventional digitization process performed on an RF signal. Referring to FIG. 1(a), two saturation boundaries are indicated with two dashed lines '1/Vmax' and '−1/Vmax,' indicating a valid analog-to-digital conversion range between a positive maximum value Vmax and a negative maximum value −Vmax. Generally, the maximum value Vmax is normalized to 1 such that the valid analog-to-digital conversion range is simplified to be between +1 and −1. Ideally, the amplitude of the amplified analog signal falls between 1/Vmax and −1/Vmax so as to best utilize the conversion range.

Referring to FIG. 1(b), if the RF signal is over-amplified, some segments of it may have amplitudes exceeding 1/Vmax or −1/Vmax and hence become saturated, resulting in digital data being maintained at +1 or −1 with the information of the signal lost. Referring to FIG. 1(c), if the RF signal is under-amplified, the maximum digitization resolution cannot be achieved, even though the amplitude of the amplified signal falls within the non-saturation region.

Conventionally, a target value to be achieved after an amplification process is set to a constant, i.e., the gain is fixed. FIG. 2 illustrates a conventional RF signal amplified with a constant gain. Referring to FIG. 2, the maximum resolution may not be efficiently used in case the RF signal itself is changed by, for instance, environmental affections. For example, in a case where an RF signal is weakened by environmental factors when it is transmitted, the actual digitization resolution under a fixed signal gain may fall between e.g., +0.8 and −0.8, failing to achieve the full maximum digitization range.

How to automatically adjust the signal gain so as to efficiently use the maximum resolution of digitization is one of the essential subjects under consideration.

SUMMARY

Accordingly, an automatic gain control circuit and an automatic gain control method are provided, capable of automatically adjusting a signal gain to adapt to the maximum digitization resolution, thus achieving an optimized efficiency of usage.

An automatic gain control circuit is provided for adjusting a gain of an amplifier, including a reference value generator, a clipping rate generator, and an automatic target value controller. The reference value generator is configured to compare a plurality of signal values obtained from a plurality of digital data with a reference value, so as to update the reference value according to a result of the comparison. The clipping rate generator is configured to calculate a number of signal values substantially equal to at least one saturation value in a plurality of signal values obtained from the digital data, so as to generate a clipping rate according to the number. The automatic target value controller generates a target value signal for adjusting the gain according to the reference value and the clipping rate.

An amplifying apparatus is provided, comprising an amplifier, an analog-to-digital sampler, and an automatic gain control circuit as described above. The amplifier receives an RF signal and amplifies the RF signal according to a gain. The analog-to-digital sampler receives the amplified RF signal and samples and digitizes the amplified RF signal during every time period, thereby outputting a plurality of digital data varying between a positive saturation value and a negative saturation value. The automatic gain control circuit, which is coupled to the analog-to-digital sampler and the amplifier, receives the digital data and adjusts the gain of the amplifier.

An automatic gain control method is provided for adjusting a gain of an amplifier. The method comprises comparing a plurality of signal values obtained from a plurality of digital data with a reference value, so as to update the reference value according to a result of the comparison, calculating a number of signal values substantially equal to at least one saturation value in a plurality of signal values obtained from the digital data, so as to generate a clipping rate according to the number, and outputting a target value for adjusting the gain according to the reference value and the clipping rate.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the embodiments.

DESCRIPTION OF THE EMBODIMENTS

Figure 1:
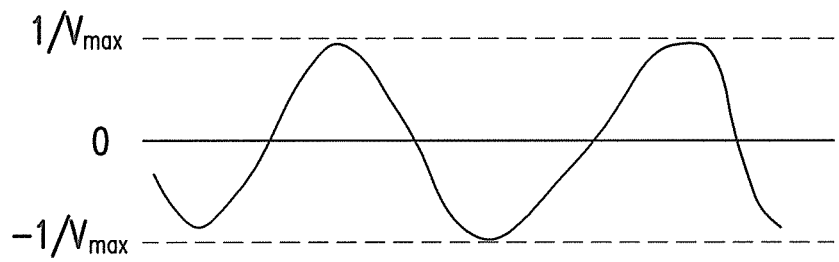
FIG. 1 illustrates a conventional digitization process performed on an RF signal.
Figure 1:
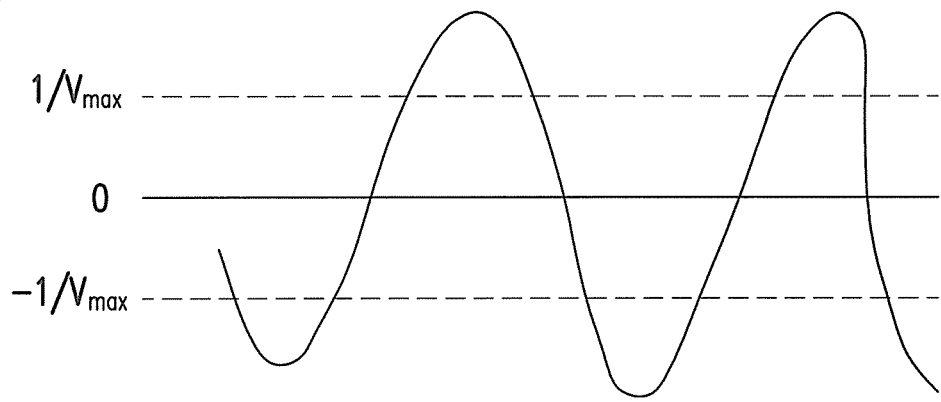
Figure 1:
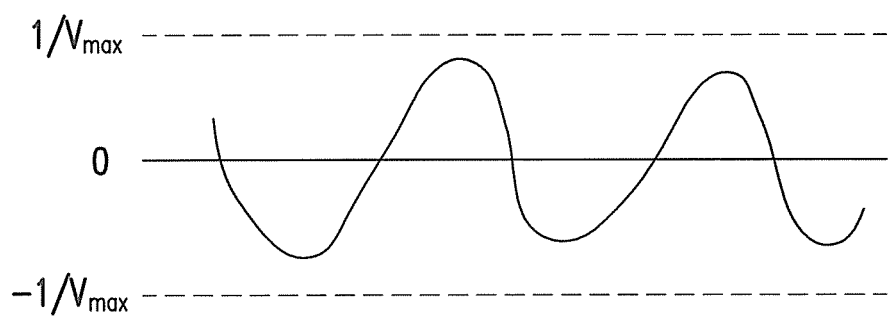
Figure 2:
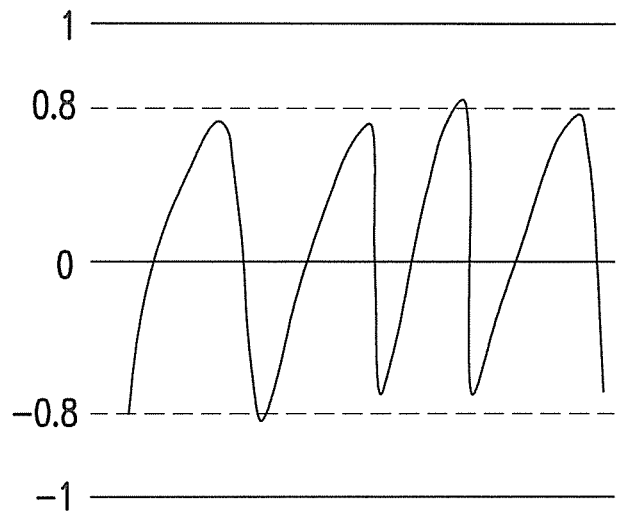
FIG. 2 illustrates a conventional RF signal with a constant gain.

Reference will now be made in detail to the present preferred embodiments of the invention, examples of which are illustrated in the accompanying drawings. Wherever possible, the same reference numbers are used in the drawings and the description to refer to the same or like parts.

An automatic gain control circuit and an automatic gain control method are provided. Different from conventional techniques that set a target value to be achieved after a signal is amplified to a constant, the circuit and method can effectively and automatically adjust the target value substantially corresponding to an optimized gain so as to adapt to the maximum resolution of digitization, thus achieving an optimized usage efficiency of resolution. Several embodiments are provided for describing the disclosure. The disclosure is not just limited to the embodiments, and proper combinations between the embodiments may also be made.

Before the automatic gain control circuit is completely described, respective circuit structures and operation mechanisms of a reference value generator and a clipping rate generator adopted in the automatic gain control circuit will be described.

Figure 3:
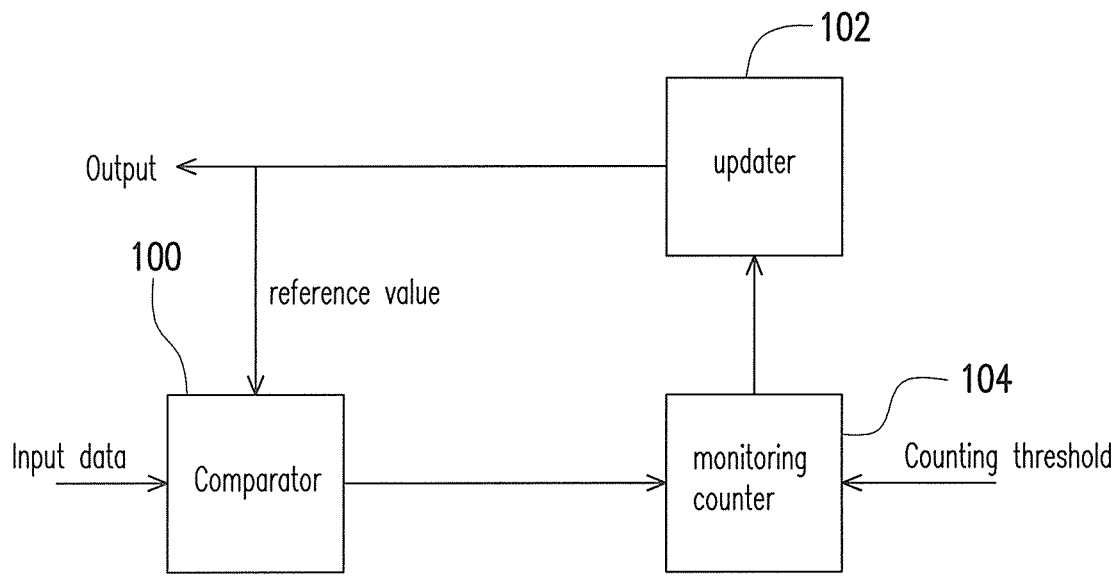
FIG. 3 is a block diagram of a reference value generator, according to an embodiment.

FIG. 3 is a block diagram of a reference value generator according to an embodiment. Referring to FIG. 3, the reference value generator includes a comparator 100, an updater 102, and a monitoring counter 104. In the embodiment, the input data of the comparator 100 can be multiple power values, which can be obtained after an RF signal is amplified, sampled and digitized into a sequence of multiple digital data that further undergoes a power calculation. The comparator 100 can be configured to compare the power values with the current power reference value, e.g., to check whether or not the power values are greater than the current power reference value.

It is noted that, considering that a power value is proportional to a squared signal value, digitized values at the sampling points can be preferably squared to perform the power calculation. However, in other embodiments of power calculation, the absolute values of the digital data can also be directly taken or other calculations can be utilized. After the power calculation, the obtained power values can only depend upon the absolute values of the digital data, irrelevant to their signs of +/−.

It is also noted that the signal values received and compared by the comparator 100 can also be other values relating to the respective voltage values of the digital data without being limited only to the power values. For example in one embodiment, the comparator 100 can receive the peak-to-peak voltage values of the digital data and compare them to a peak-to-peak voltage reference value.

The monitoring counter 104 can monitor a result of the comparison in the comparator 100, and during each period of set time, it can count the number of the signal values (e.g., the power value or the peak-to-peak voltage value) greater than the reference value (e.g., power reference value or peak-to-peal voltage reference value). The period of time is, for example, one minute. The reference value at first can be preset to an initial value and then automatically adjusted in accordance with the result of the comparison. A counting threshold value can be set within the monitoring counter 104. When the number counted by the monitoring counter 104 is greater than the counting threshold value, indicating that the current reference value is smaller than the actual signal value, the updater 102 can increase the current reference value, for example, by adjusting it up one step value. Contrarily, when the number counted by the monitoring counter 104 is less than the counting threshold value, indicating that the current reference value is larger than the actual signal value, the updater 102 can decrease the current reference value, for example, by adjusting it down one step value.

The counting threshold value can be, for example, 10, according to experience. As a result, when the counted number of the monitoring counter 104 is close or equal to the counting threshold value, the corresponding reference value is approximate to the actual signal value. In other words, the updated reference value can reflect the actual signal value. The reference value can be fed back to the comparator 100 and also provide to other units for later use to adjust the gain of the RF amplifier. Detailed operation mechanism is to be described later.

It is also noted that, different mechanisms can be implemented to realize the comparison of the signal values respectively with the reference value to update the reference value, e.g., as long as the updated reference value can reflect the actual signal value. For example, in an embodiment, the number of the signal values greater than the reference value is considered to adjust the reference value. In other embodiments, however, the reference value can also be updated according to the number of the signal values less than the reference value. In addition, in the foregoing embodiments, whether the counted number is greater or less than the counting threshold value, is considered to increase or decrease the reference value by one step value. In other embodiments for example, however, the decrease or increase quantity of the reference value can also be determined directly based on the quantity of the counted number.

Figure 4:
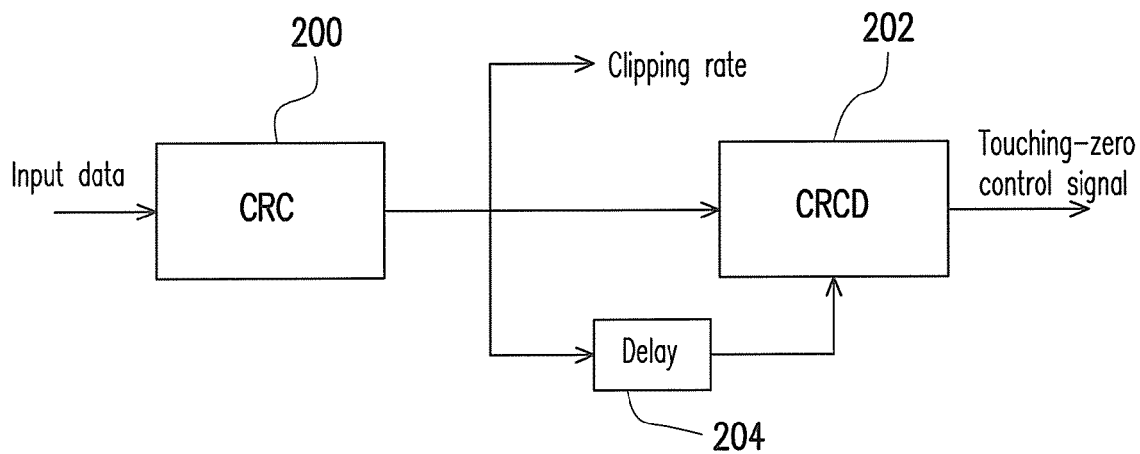
FIG. 4 is a block diagram of a clipping rate generator according to an embodiment.

FIG. 4 is a block diagram of a clipping rate generator according to an embodiment. Referring to FIG. 4, the clipping rate (CR) generator includes a clipping rate calculator (CRC) 200, a clipping rate touching-zero detector (CRCD) 202, and a delay device 204.

Input data to the CRC 200 can also be the same as the digital data input to the comparator 100, such as multiple power values. The CRC 200 is implemented to count the number of the input data in a saturation state during each time period (for example, one minute). In an embodiment, if the saturation power value is 1, the CRC 200 then counts the number of the input data having the value 1 during each minute. After that, the CRC 200 outputs the counted number as a clipping rate (CR) and continues counting for the next time period. Besides being able to output to other units for subsequent processes to adjust the gain of an RF amplifier, the clipping rate can also output to the CRCD 202 and the delay device 204.

It is noted that the input data of the CRC 200 can also be other signal values dependent on the respective voltage values of the digital data, such as voltage peak values. If the positive saturation voltage and the negative saturation voltage of the digital data are +1 and −1, respectively, the CRC 200 can calculate the number of the signal values (i.e., the voltage peak values) of the digital data equal to either +1 or −1 in each minute to obtain the CR value.

The CRCD 202 detects whether or not the clipping rate touches zero in variation with time. Because the delay device 204 delays the clipping rate before it outputs it to the CRCD 202 for comparison, that is, the CRCD 202 compares the current clipping rate with a previous clipping rate, the CRCD 202 is able to recognize the change of the clipping rate between any two consecutive time points. The CRCD 202 can particularly detect an event in which the clipping rate changes from 0 to a positive value (for example, 1) or from the positive value to 0. When the CRCD 202 detects an occurrence of such an event, it can output a touching-zero control signal indicating the occurrence of the event.

Figure 5:
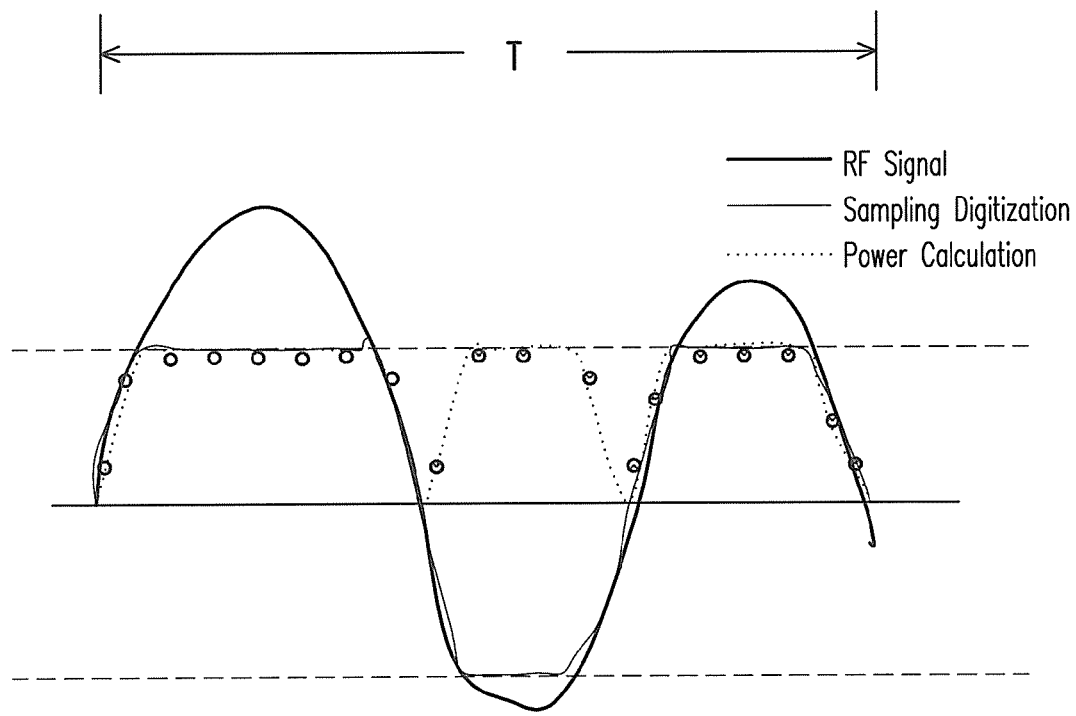
FIG. 5 illustrates a clipping rate statistical mechanism according to an embodiment.

FIG. 5 illustrates a counting mechanism of the clipping rate according to an embodiment. Referring to FIG. 5, taking a time period T for example, an analog signal is sampled at time points shown in the figure. If the values of the amplified analog signal at some time points exceed a saturation value denoted by the dotted line, these values will be converted to a positive saturation value or a negative saturation value (for example, +1 or −1) after being digitized, and further changed to a saturation power value (e.g., +1) after undergoing power calculation. Accordingly, the CR value can be obtained by counting the number of the dots falling on the dashed line during the time period T.

Figure 6:
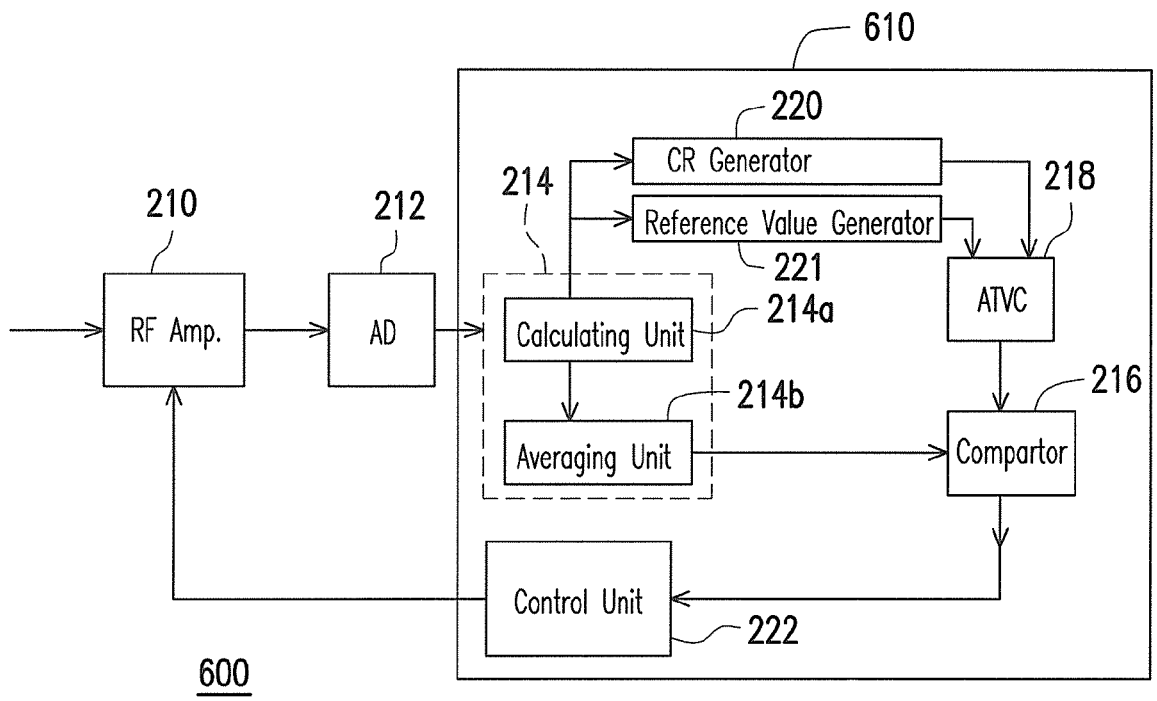
FIG. 6 is a block diagram of an amplifying apparatus with an automatic gain control circuit according to an embodiment.

FIG. 6 is a block diagram of an automatic gain control circuit and an amplifying apparatus employing the automatic gain control circuit, according to an embodiment. Referring to FIG. 6, the amplifying apparatus 600 can include an RF amplifier 210, which is implemented to receive an RF signal and amplify the RF signal according to a gain. The RF amplifier 210 can be, for example, a variable gain amplifier (VGA) with an adjustable gain. In addition, the amplifying apparatus 600 also includes an analog-to-digital sampler (AD) 212, which can receive the amplified RF signal, and sample and digitize the amplified RF signal during every time period so as to output a sequence of digital data. In addition, the amplifying apparatus 600 further includes an automatic gain control circuit 610, which can receive the digital data and automatically adjust the gain of the RF amplifier 210 according to the digital data.

As discussed in foregoing descriptions, for the digitization resolution of the analog-to-digital sampler 212, there are saturation values, i.e., a positive saturation voltage value and a negative saturation voltage value. In other words, the digital data after being processed by the analog-to-digital sampler 212 can vary between the positive saturation voltage value and the negative saturation voltage value. For benefit of easy processing, the positive saturation voltage value can be set to +1 and the negative saturation voltage value can be set to −1. However, if the gain of the RF amplifier 210 is too large, some values of the RF signal after being amplified, sampled and digitized may all be converted to the saturation value and therefore lose their information about the amplitude variation of the RF signal, resulting in errors. Contrarily, if the gain of the RF amplifier 210 is too small, some values of the RF signal after being amplified, sampled and digitized may be far away from the saturation value, resulting in an inefficient usage of the digitization resolution. These issues can be solved by the automatic gain control circuit 610, which, based on an operation mechanism to be described later, can automatically adjust the gain of the RF amplifier 210 to be an optimized gain.

The automatic target value controller 218 can, according to the reference value provided from the reference value generator 221 and the clipping rate and the control signal indicating the variation in the clipping rate provided from the clipping rate generator 220, cooperate with the comparator 216 and control circuit 222 to control the gain of the RF amplifier. More specifically, the automatic target value controller 218 can output a target value to the comparator 216, which then generates an output according to the target value and an average value provided by the processing unit 214, and provides the output to the control circuit 222. The control circuit 222 such as a loop-filter or a phase-lock loop is configured to judge whether the received output is positive or negative, so as to output a step-type control signal to adjust the gain of the RF amplifier 210. Details of the structure and the operation are further described for each unit.

In FIG. 6, the automatic gain control circuit 610 can include a processing unit 214, a reference value generator 221, a clipping rate generator 220, and an automatic target value controller (ATVC) 218. The processing unit 214 includes, for example, a calculating unit 214a, which can receive the digital data from the analog-to-digital sampler (AD) 212 and generate multiple signal values dependent on the respective voltage values of the digital data.

In one embodiment, the calculating unit 214a performs a power calculation on the digital data at each sampling point to output multiple power values as the signal values, which are also provided to both the reference value generator 221 and the clipping rate generator 220. After processed by the calculating unit 214a, negative values of the digital data output from AD 212 are all transformed into positive values, wherein the positive saturation value, such as +1, and the negative saturation value, such as −1, are both transformed into the same saturation power value, such as 1. As a result, the power values can vary between 0 and the saturation power value. In other embodiments, the calculating unit 214a can, for example, take the absolute value, squared value, or any other values obtained from various power calculations. However, considering the proportional relationship between power and the squared amplitude, it is preferred to take the squared value.

In addition, the processing unit 214 also includes an averaging unit 214b, which is used to calculate an average value of the power values in every period of time and provide the average value to the comparator 216 for comparison.

The reference value generator 221 can subsequently output the updated reference value, such as the peak-to-peak reference value or power reference value, to the ATVC 218. The clipping rate generator 220 can also output the CR value and the control signal to the ATVC 218. The structures and operation mechanisms of the reference value generator 221 and the clipping rate generator 220 have been described in FIG. 3 and FIG. 4 and relevant descriptions, respectively.

After the ATVC 218 receives the reference value, the CR value and the control signal, it can automatically adjust the gain of the RF amplifier after performing several monitoring and adjustment steps based on a result of the comparison of the comparator 216.

The comparator 216 subtracts the target value output from the ATVC 218 by the average value output from the averaging unit 214a and then outputs a subtraction value to the control circuit 222 to change the gain of the RF amplifier.

In the control circuit 222, a positive subtraction value can cause the control signal to increase the gain of the amplifier by one step value. Contrarily, a negative subtraction value can cause the control signal to decrease the gain of the amplifier by one step value. After a few steps of adjustment, the signal amplified by the gain can reach the target value.

It is noted that, in other embodiments, the calculating unit 214a can be modified to directly provide the peak-to-peak voltage values of the digital data to the reference value generator 221. Then, the averaging unit 214b can directly take the average of the peak-to-peak voltage values to produce the average value. Similarly, in other embodiments, the calculating unit 214a can be modified to directly provide the voltage peak values of the digital data to the clipping rate generator 220. In addition, in such embodiments, since the reference value generator 221 and the clipping rate generator 220 performs calculations directly on the peak-to-peak voltage values and the voltage peak values, respectively, the calculating unit 214a may be omitted.

Summarily, according to different designs, the signal values processed by the reference value generator 221 and the clipping rate generator 220 can be the same signal values, such as power values; or conversely, they can be different, such as power values and voltage peak values respectively, or peak-to-peak voltage values and power values respectively, or peak-to-peak voltage values and voltage peak values respectively, . . . , and so on.

Likewise, in other embodiments, the averaging unit 214a can also be configured to take an average of other different signal values dependent on the voltages of the digital data, such as peak-to-peak voltage values.

In addition, it is noted that in the embodiments, for example, the calculating unit 214a, the clipping rate generator 220, the reference value generator 221 and the units are shown and described as different units. These illustrations and descriptions, however, are for exemplary purposes only. For example, in other embodiments, these units can be integrated into a single unit according to design requirements. In an example, at least one of the clipping rate generator 220 and the reference value generator 221 can directly receive the digital data for subsequent analysis and process.

Figure 7:
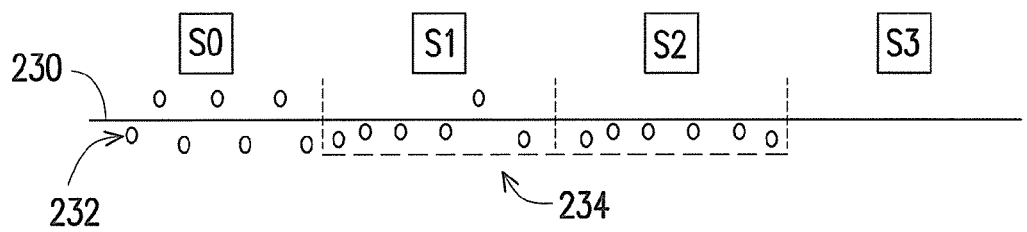
FIG. 7 illustrates the operation mechanism of an automatic target value controller (ATVC) according to an embodiment.

FIG. 7 illustrates the operation mechanism of an automatic target value controller (ATVC) 218 according to an embodiment. In FIG. 7, a reference line 230 represents the saturation value of AD 212, such as 1, and numerical dots 232 represent the CR values. The CR values below the reference line 230 represent 0, indicating that the signal needs to be amplified and the gain should be increased. Contrarily, the CR values beyond the reference line 230 represent 1, indicating that the signal needs to be reduced and the gain should be decreased. The monitoring mechanism for different states is also explained hereafter in reference with FIGS. 4, 6, and 7.

In state S0, according to the touching-zero control signal of the CRCD 202 and the CR value of the CRC 200 in the clipping rate generator 220, the ATVC 218 can adjust the target value signal, by which the gain of the RF amplifier can be adjusted. When the maximum peak value of the signal is approaching to the saturation value of the AD 212, the CR value is frequently oscillating in the neighbourhood of zero because of some tiny environment interferences. Therefore, after the gain adjustment, when the ATVC 218 checks and finds that the CR value is frequently oscillating around 0, it can determine that the signal peak value amplified by the amplifier gain is close to the saturation level of the AD 212. In one embodiment, a judgement criteria for a frequent touching-zero oscillation can be that among any two adjacent CR values, one is 1 and the other one is 0. That is, the CR value is consecutively changing as . . . →0→1→0→1 . . . . However, the judgment criteria can also be changed according to practical requirements.

In state S1, the ATVC 218 checks the reference value output from the reference value generator 212, such as peak-to-peak voltage reference value or power reference value. If the reference value has not reached the minimum threshold value 234, such as 0.9, then the ATVC 218 adjusts the target value signal to increase the gain of the amplifier, thereby making the reference value reach at least the minimum threshold value 234.

At the same time, if the CR value exceeds 0 again, the state becomes state S2. In state S2, the ATVC 218 adjusts the target value signal to reduce the gain of the RF amplifier 210, so that the CR value returns to 0. When the CR value remains at 0 for a predetermined period of time, it can be decided that the gain of the amplifier is optimized and therefore locked.

In state S3, the CR value is continuously monitored. When either of the reference value and the CR value changes due to variations of environment, the state will return to state S0 to readjust the gain of the amplifier.

Figure 8:
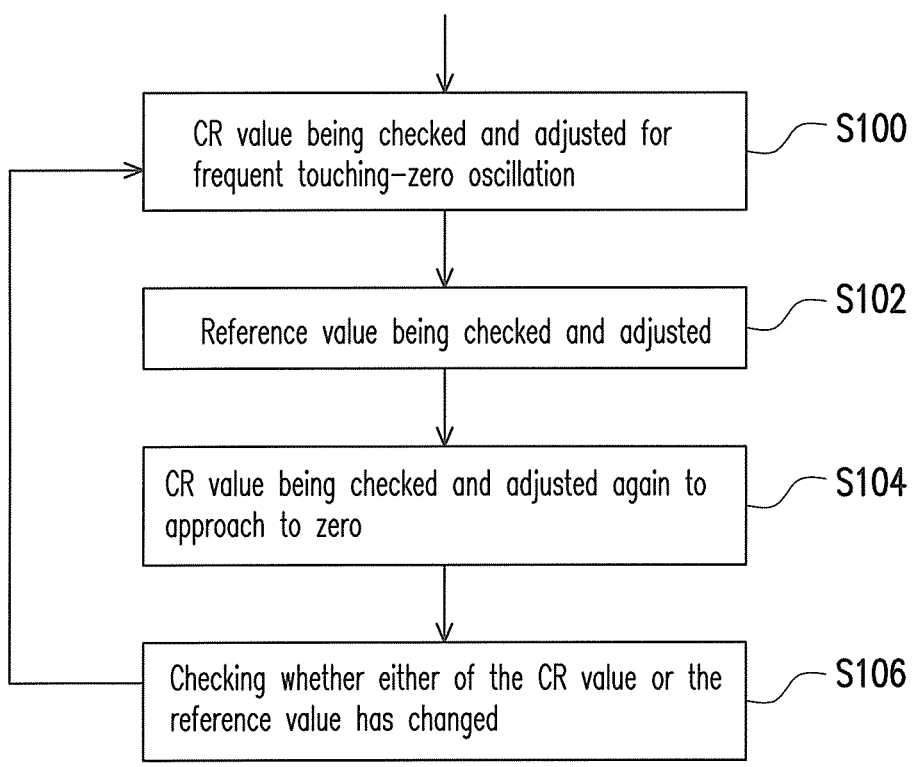
FIG. 8 is a flowchart illustrating the steps executed by an ATVC.

FIG. 8 is a flowchart illustrating the steps executed by an ATVC. In FIG. 8, the foregoing operations of the automatic target value controller 218 can be summarized into several monitoring steps. In step S100, the CR value is checked and adjusted for frequent touching-zero oscillation. In step S102, the reference value is checked and adjusted. In step S104, the CR value is checked and adjusted again to approach to zero. In step S106, it is checked whether either of the CR value or the reference value has changed. If there is any change in the CR value or the reference value, then the process returns to the step S100. It is noted that, in other embodiments, the sequence of the steps in FIG. 8 can be altered without being restricted to the specific sequence in FIG. 8.

In the foregoing embodiments, by checking the CR value and the reference value, the input signal can be properly amplified or reduced and thereby maintained within the most probable range of sampling and digitization. The foregoing embodiments can at least reduce the saturation degree of signal during digitization, thus achieving the maximum digitization resolution.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. An automatic gain control circuit, used to adjust a gain of an amplifier, comprising:
   a reference value generator, configured to compare a plurality of signal values obtained from a plurality of digital data with a reference value, so as to update the reference value according to a result of the comparison;
   a clipping rate generator, configured to calculate a number of signal values substantially equal to at least one saturation value in a plurality of signal values obtained from the plurality of digital data, so as to generate a clipping rate according to the number; and
   an automatic target value controller, to generate a target value signal for adjusting the gain of the amplifier according to the reference value and the clipping rate.

2. The automatic gain control circuit according to claim 1, further comprising a processing unit configured to receive the digital data and generate a plurality of signal values dependent on respective voltage values of the digital data for outputting to at least one of the reference value generator and the clipping rate generator.

3. The automatic gain control circuit according to claim 2, wherein the processing unit further generates an average value according to a plurality of signal values obtained from the digital data, and
   the automatic target value controller comprises:
   a comparator, judging whether or not a target value represented by the target value signal is greater than the average value, thereby outputting an adjusting signal according to a result of the judgment; and
   a controlling circuit, receiving the adjusting signal to control the gain of the amplifier according to the adjusting signal.

4. The automatic gain control circuit according to claim 3, wherein the average value is an average of either peak-to-peak voltage values or power values of the digital data.

5. The automatic gain control circuit according to claim 1, wherein the clipping rate generator further analyzes the variation in the clipping rate with time to output a control signal, and the automatic target value controller generates the target value signal further according to the control signal.

6. The automatic gain control circuit according to claim 1, wherein the signal values generated by the reference value generator include ones of peak-to-peak voltage values and power values of the digital data.

7. The automatic gain control circuit according to claim 1, wherein the signal values of the clipping rate generator include at least ones of voltage peak values and power values of the digital data, the at least one saturation value is either a positive saturation voltage value and a negative saturation voltage value, or a saturation power value.

8. The automatic gain control circuit according to claim 1, wherein the reference value generator comprises:
   a comparator, for comparing the signal values with the reference value;
   a monitoring counter, for counting a number of the signal values that are greater than the reference value; and
   an updater, for increasing the reference value when the number is greater than a counting threshold value and decreasing the reference value when the number is less than the counting threshold value.

9. The automatic gain control circuit according to claim 1, wherein the clipping rate generator comprises:
   a clipping rate calculator (CRC), for receiving the signal values and comparing the signal values with the at least one saturation value to generate the clipping rate;
   a delay device, for delaying the clipping rate; and
   a clipping rate touching-zero detector, for judging whether or not the clipping rate touches zero according to the current clipping rate generated by the clipping rate calculator and the clipping rate delayed by the delay device, thereby outputting to the automatic target value controller a control signal according to a result of the judgement.

10. The automatic gain control circuit according to claim 1, wherein the operation of the automatic target value controller comprises at least one of the actions:
    adjusting the target value signal according to the reference value, thereby causing the reference value to approach to a minimum threshold value; and
    adjusting the target value signal according to the clipping rate, thereby causing the clipping rate to approach to zero.

11. The automatic gain control circuit according to claim 1, wherein the operation of the automatic target value controller comprises at least one of the actions:
    monitoring the clipping rate in variation with time, and adjusting the gain of the amplifier by adjusting the target value signal, until the clipping rate oscillates in the neighborhood of zero and touches zero;
    monitoring whether or not the reference value is less than a minimum threshold value, if not, adjusting the target value signal to increase the gain of the amplifier until the reference value is increased to the minimum threshold value;
    monitoring whether or not the clipping rate is equal to zero, if not, adjusting the target value signal to decrease the gain of the amplifier until the clipping rate is decreased to zero; and
    continuously monitoring whether or not one of the clipping rate and the reference value has changed, if so, restarting the foregoing monitoring steps.

12. The automatic gain control circuit according to claim 11, wherein during the touching-zero oscillation in the neighbourhood of zero, one of any two values of the clipping rate is 0 and the other is 1.

13. An amplifying apparatus, comprising:
    an amplifier, receiving an RF signal and amplifying the RF signal according to a gain;
    an analog-to-digital sampler, receiving the amplified RF signal, and sampling and digitizing the amplified RF signal during every time period, thereby outputting a plurality of digital data varying between a positive saturation value and a negative saturation value; and
    an automatic gain control circuit according to claim 1, coupled to the analog-to-digital sampler and the amplifier to receive the digital data and adjust the gain of the amplifier.

14. An automatic gain control method, used to adjust a gain of an amplifier, comprising:
    comparing a plurality of signal values obtained from a plurality of digital data with a reference value to update the reference value according to a result of the comparison;
    calculating a number of signal values substantially equal to at least one saturation value in a plurality of signal values obtained from the digital data to generate a clipping rate according to the number; and
    outputting a target value for adjusting the gain according to the reference value and the clipping rate.

15. The automatic gain control method according to claim 14, further comprising generating, according to the digital signal, a plurality of signal values dependent upon respective voltage values of the digital data, for use in at least one of the steps of updating the reference value and generating the clipping rate.

16. The automatic gain control method according to claim 14, further comprising analyzing a variation in the clipping rate with time, thereby outputting a control signal, wherein the generation of the target value signal is performed further according to the control signal.

17. The automatic gain control method according to claim 14, wherein in the step of updating the reference value, the signal values include ones of peak-to-peak voltage values and power values of the digital data, and the reference value is one of a peak-to-peak voltage reference value and a power reference value.

18. The automatic gain control method according to claim 14, wherein in the step of generating the clipping rate, the signal values includes ones of voltage peak values and power values of the digital data; and the at least one saturation value is either a positive saturation voltage value and a negative saturation voltage value, or a saturation power value.

19. The automatic gain control method according to claim 14, wherein the step of updating the reference value comprises:
    performing a comparing step to compare the signal values with the reference value;
    performing a monitoring counting step to count a number of the signal values greater than the reference value; and
    performing an updating step to increase the reference value when the number is greater than a counting threshold value and decrease the reference value when the number is less than the counting threshold value.

20. The automatic gain control method according to claim 14, wherein the step of analyzing the clipping rate comprises:
    delaying the clipping rate; and
    analyzing the current clipping rate and the delayed clipping rate to judge whether or not the clipping rate touches zero in variation with time, and outputting a control signal according to a result of the judgement, wherein generating the target value signal is performed further according to the control signal.

21. The automatic gain control method according to claim 14, wherein the step of adjusting the gain comprises at least one of the steps:

adjusting the target value signal according to the reference value, thereby causing the reference value to approach to a minimum threshold value; and adjusting the target value signal according to the clipping rate, thereby causing the clipping rate to approach to zero.

22. The automatic gain control method according to claim 14, wherein the step of adjusting the gain includes at least one of the steps:

monitoring the clipping rate in variation with time, and adjusting the gain of the amplifier by adjusting the target value signal, thereby enabling the clipping rate to oscillate in the neighborhood of zero and touch zero;

monitoring whether or not the reference value is less than a minimum threshold value, if not, then adjusting the target value signal to increase the gain of the amplifier until the reference value is increased to the minimum threshold value;

monitoring whether or not the clipping rate is equal to zero, if not, then adjusting the target value signal to decrease the gain of the amplifier until the clipping rate is decreased to zero; and continuously monitoring whether or not one of the clipping rate and the reference value has changed, if so, then restarting the foregoing monitoring steps.

23. The automatic gain control method according to claim 22, wherein during the touching-zero oscillation in the neighbourhood of zero, one of any two adjacent values of the clipping rate is 0 and the other is 1.

24. The automatic gain control method according to claim 14, wherein the step of the gain comprises:

generating an average value according to signal values generated from the digital data;

judging whether or not a target value represented by the target value signal is greater than the average value, and outputting an adjusting signal according to a result of the judgment; and controlling the gain of the amplifier according to the adjusting signal.

25. The automatic gain control method according to claim 24, wherein the average value is an average of either peak-to-peak voltage values or power values of the digital data.

* * * * *